United States Patent [19]

Vogen et al.

[11] Patent Number: 4,948,971
[45] Date of Patent: Aug. 14, 1990

[54] VIBRATION CANCELLATION SYSTEM FOR SCANNING ELECTRON MICROSCOPES

[75] Inventors: Wayne V. Vogen, Oakland; Martin D. Mannion, Santa Cruz, both of Calif.

[73] Assignee: Amray Inc.

[21] Appl. No.: 270,369

[22] Filed: Nov. 14, 1988

[51] Int. Cl.⁵ .............................................. H01J 37/28
[52] U.S. Cl. .................................. 250/310; 250/311; 250/306; 250/307
[58] Field of Search ................ 250/310, 306, 307, 311

[56] References Cited

U.S. PATENT DOCUMENTS

| | | | |
|---|---|---|---|
| 2,547,994 | 4/1951 | Bertein | 250/397 |
| 3,158,733 | 11/1964 | Sibley | 250/396 |
| 3,371,161 | 2/1968 | Crovella | 358/222 |
| 3,393,320 | 7/1968 | Arazi | 358/222 |
| 3,456,074 | 7/1969 | Wilson | 178/7.2 |
| 3,515,881 | 6/1970 | Philbrick et al. | 250/213 |
| 3,571,590 | 3/1971 | Katagiri et al. | 250/49.5 |
| 3,576,438 | 4/1971 | Pease | 250/311 |
| 3,577,205 | 5/1971 | Hobrough | 250/213 |
| 3,619,500 | 11/1971 | Bouley et al. | 178/7.8 |
| 3,934,187 | 1/1976 | Trotel | 318/640 |
| 4,071,765 | 1/1978 | van Oostrum et al. | 250/397 |
| 4,097,740 | 6/1978 | Muller et al. | 250/311 |
| 4,618,766 | 10/1986 | van der Mast et al. | 250/311 |

FOREIGN PATENT DOCUMENTS

| | | | |
|---|---|---|---|
| 1374702 | 8/1964 | France | 250/311 |
| 49948 | 9/1966 | German Democratic Rep. | 250/311 |
| 55-121256 | 9/1980 | Japan | 250/311 |
| 56-126927 | 10/1981 | Japan | 250/396 ML |
| 586324 | 12/1977 | Switzerland | 250/397 |
| 2059120A | 4/1981 | United Kingdom | 250/311 |

OTHER PUBLICATIONS

R. R. Trotter; IBM Technical Disclosure Bulletin, Jun. 1979.

*Primary Examiner*—Jack I. Berman

[57] ABSTRACT

A method and system to reduce the sensitivity of instruments such as scanning electron microscopes to vibrations and similar disturbances. In the preferred embodiment, the system includes at least two velocity sensors connected to the specimen stage of the microscope to detect vibrations in two independent directions, integrators to integrate output signals from the velocity sensors to indicate displacement of the specimen stage in the two directions, and a beam steering device that receives signals from the integrators and adjusts the normal scanning pattern of the electron beam of the microscope to reduce the effect of vibrations.

17 Claims, 2 Drawing Sheets

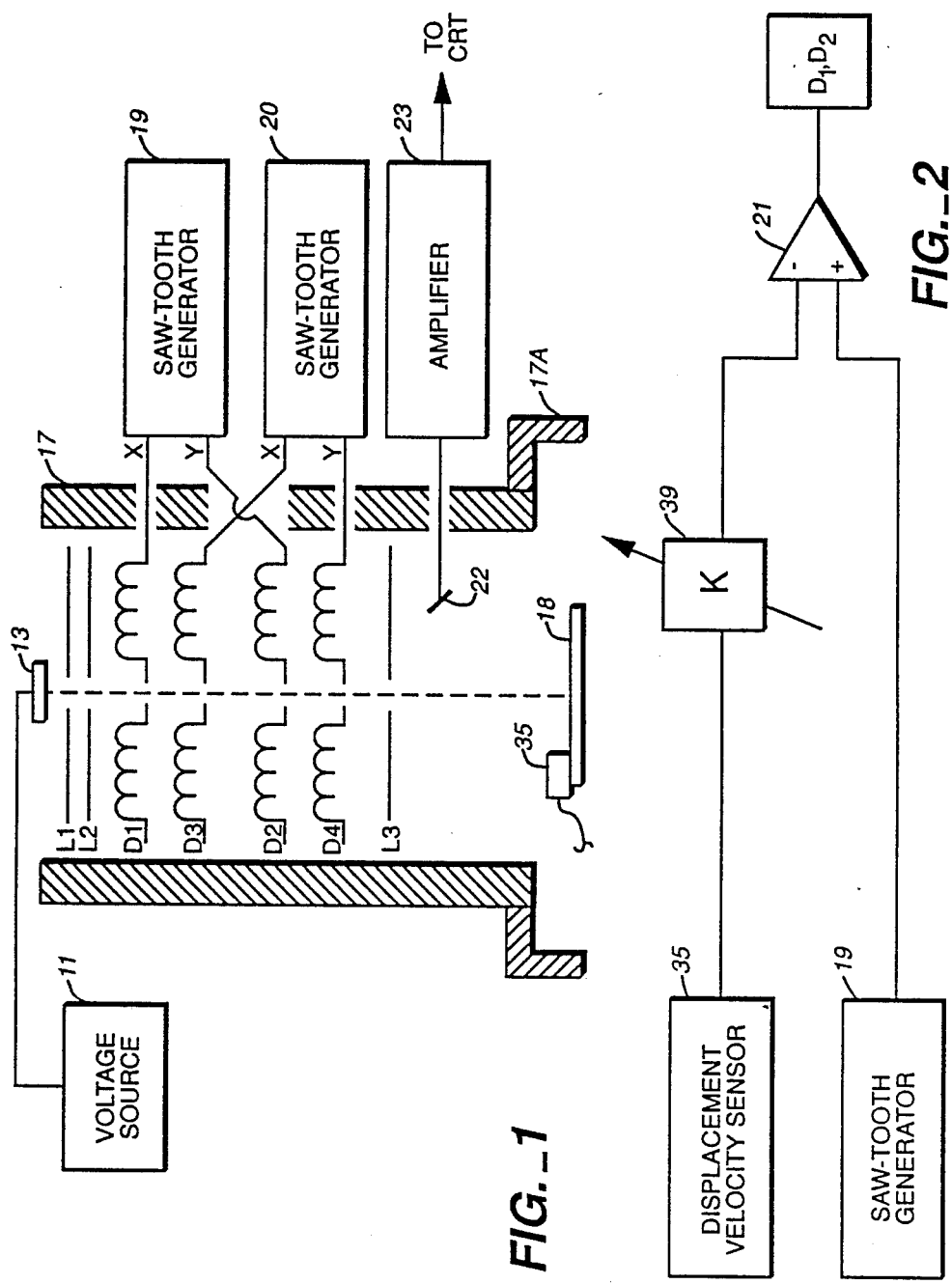

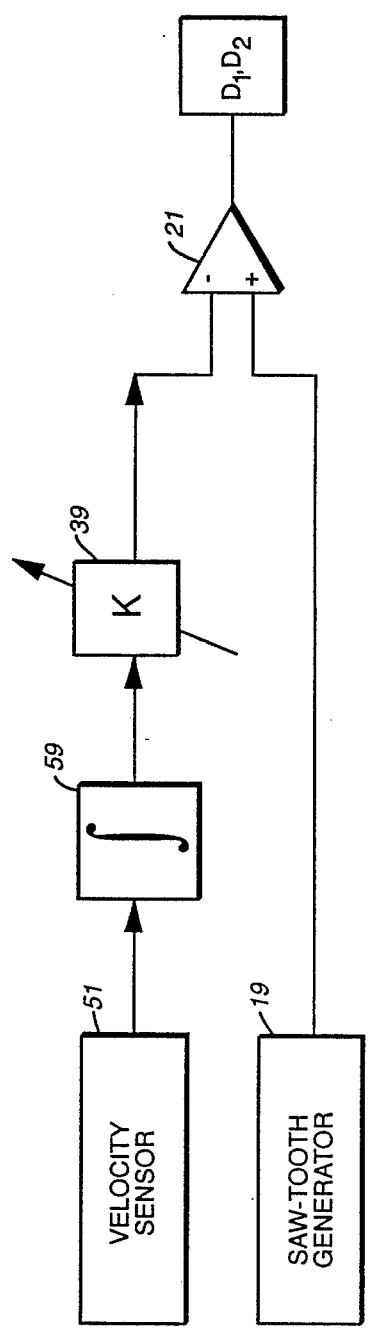
FIG._3
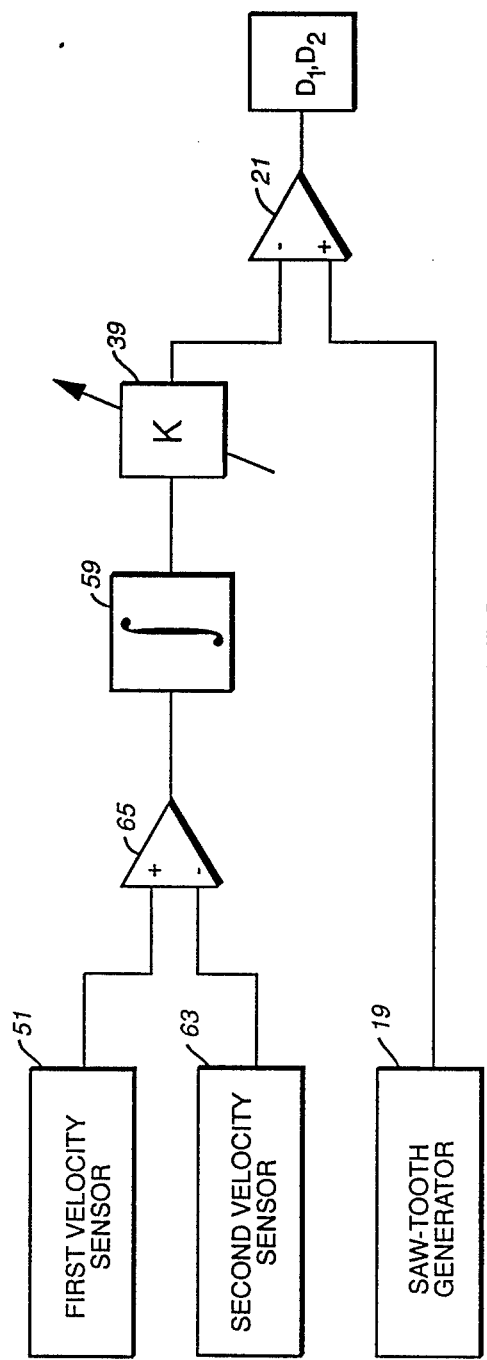
FIG._4

VIBRATION CANCELLATION SYSTEM FOR SCANNING ELECTRON MICROSCOPES

BACKGROUND OF THE INVENTION

1. Field of the Invention

The present invention generally relates to instruments such as scanning electron microscopes having scanning electron beams and, more particularly, to systems that improve the resolution provided by such instruments.

2. State of the Art

Instruments such as scanning electron microscopes are increasingly being used to support manufacturing operations. For example, in semi-conductor wafer processing facilities, scanning electron microscopes are employed for on-line inspections and measurements. Because of the short wavelengths of their source electrons, scanning electron microscopes have several advantages as compared to optical microscopes. For example, scanning electron microscopes provide resolutions from about one hundred to about two hundred angstroms in semi-conductor production applications, while the limiting resolution with optical microscopes is about 2,500 angstroms (i.e., 0.25 microns). Stated somewhat differently, the practical limit to magnification with optical microscopes is about 2,000X, while magnification for scanning electron microscopes broadly ranges from about 25X up to about 300,000X. Moreover, scanning electron microscopes provide depths of field which are several orders of magnitude greater than optical microscopes.

At the high magnifications provided by scanning electron microscopes, even slight vibrations can seriously impair image quality. To alleviate the effects of structural vibrations on image quality, scanning electron microscopes are usually mounted on elastic vibration-isolating structures. Such isolating structures are relatively effective in at least partially attenuating many, but not all, structural vibrations above a few cycles per second. To further alleviate the effects of structural vibrations, it is desirable to rigidly connect the specimen stage in a scanning electron microscopes to the scanning electron microscope's chamber. In the ideal case, the stage-to-chamber connecting structure is sufficiently stiff that vibrations affect both the stage and chamber equally and, therefore, do not affect the electron beam scanning pattern. Such rigidity cannot be practically achieved, however, in scanning electron microscopes that have moveable or adjustable specimen stages.

In scanning electron microscopes with movable specimen stages, vibrations continue to be a problem in terms of loss of image resolution at high magnifications. Image degradation is especially acute when such scanning electron microscopes are used in "clean rooms" in semiconductor manufacturing facilities. The environment in clean rooms normally includes acoustic vibrations as well as structural vibrations caused by machinery and the turbulence of high flow rates of ambient air. Thus, scanning electron microscopes in such environments are exposed to high-frequency vibrations as well as low-frequency vibrations. Moreover, it has been found that acoustic vibrations are often not effectively attenuated by the elastic vibration-isolating structures which are conventionally provided to alleviate the effects of structural vibrations.

In view of the preceding discussion, it can be appreciated that a need exists for ways and means to allow scanning electron microscopes to be used at high resolutions in environments that expose the scanning electron microscopes to vibrations that are not completely attenuated by elastic supporting structures.

SUMMARY OF THE INVENTION

Generally speaking, the present invention provides systems to adjust the scanning pattern of an electron beam in instruments such as scanning electron microscopes to decrease image sensitivity to vibrations or similar disturbances. In its preferred embodiment, the system of the present invention includes at least two velocity sensors connected to the specimen stage of the microscope to sense vibrations of the stage in at least two independent directions, integrators to integrate output signals from the velocity sensors to indicate displacements of the specimen stage, and means connected to receive displacement signals from the integrators to adjust the normal scanning pattern of the electron beam of the microscope to at least partially cancel the effects of the sensed vibrations.

BRIEF DESCRIPTION OF DRAWINGS

In the drawings:

FIG. 1 is a generally schematic diagram of a scanning electron microscope;

FIG. 2 is a generalized block diagram of a vibration cancellation system according to the present invention for use with the scanning electron microscope of FIG. 1;

FIG. 3 is a schematic diagram of one embodiment of the vibration cancellation system of FIG. 2; and FIG. 4 is a schematic diagram of another embodiment of the vibration cancellation system of FIG. 2.

DETAILED DESCRIPTION OF THE PREFERRED EMBODIMENT

FIG. 1 schematically shows a typical scanning electron microscope 7 having a voltage source 11 connected to provide potential to an electron source 13. Electron source 13 is positioned to direct a beam of electrons toward a specimen stage 18 through a plurality of electron lenses such as lenses $L_1$, $L_2$ and $L_3$. Electron source 13 and the lenses $L_1$, $L_2$ and $L_3$ are all housed in a cylindrical column 17 comprising a structure often referred to as an electron optical column. Connected to column 17 is a chamber 17A which surrounds and supports a specimen stage 18. Together, optical column 17 and chamber 17A comprise the body of scanning electron microscope 7. It should be understood that the microscope is mounted on an elastic suspension system, not shown, which attenuates structural vibrations having frequencies greater than a few cycles per second (hertz).

The scanning electron microscope 7 of FIG. 1 further includes an electron beam deflection system for selectively deflecting the electron beam from source 13 to scan across specimen stage 18. In the illustrated embodiment, the deflection system comprises pairs of magnetic deflection coils $D_1$ through $D_4$, often referred to as electron beam scanning coils, housed within optical column 17 and connected to respective sawtooth voltage generators 19 and 20. In typical practice, the deflection coils are arranged to deflect the electron beam in two mutually perpendicular directions, usually designated cartesian x and y directions, respectively. The x and y directions are generally in a plane perpendicular to the beam direction, but strict orthogonality is not required. For purposes of discussion herein, it can be assumed that coils $D_1$ and $D_2$ deflect the scanning beam in the x-direction and that coils $D_3$ and $D_4$ deflect the scanning beam in the y-direction.

As still further shown in FIG. 1, an electron collector 22 is arranged adjacent the beam-receiving surface of stage 18. Normally, collector 22 is connected to an amplifier 23 and then to a cathode ray tube (CRT) monitor which provides a real-time display of the images of specimens on stage 18. Alternatively, collector 22 is connected to an analog-to-digital converter which transforms electron current to digital signals which can be stored for later analysis.

In operation of the scanning electron microscope 7 of FIG. 1, electron source 13 produces a narrow beam of highly accelerated electrons that passes through electron lenses $L_1$, $L_2$ and $L_3$. The electron lenses focus the beam on the surface of a specimen held on stage 18. In practice, the diameter of the beam at the specimen stage is usually about 0.01 micrometers or less. Concurrently, saw-tooth generators 19 and 20 provide voltage to the deflection coils $D_1$ through $D_2$ to scan the focused electron beam across specimen stage 18 in a predetermined pattern. Normally, the saw-tooth generators 19 and 20 operate synchronously so that the electron beam sweeps across the sample stage in the x-direction at a constant rate, with each scan being deflected in the y-direction relative to an adjacent scan to form a series of scanning lines that are generally parallel in the x-direction.

Further in operation of scanning electron microscope 7 of FIG. 1, collector 22 functions to detect changes in the electron current at stage 18 during scanning. Thus, as the electron beam scans a specimen on stage 18, changes in the composition, texture and topography of the specimen at the scanning points cause variations in the amplitude of the electron current detected by collector 22. When the electron current is monitored on a CRT screen during scanning, changes in the amplitude of the electron current at collector 22 cause changes in the brightness of spots, or pixels, on the CRT screen. For a complete scanning sequence, the pixels on the CRT screen create an image corresponding to features of the specimen surface. It should be appreciated that such images lose resolution when vibrations cause sufficient movement of specimen stage 18 during beam scanning to distort the scanning pattern. In fact, vibrations causing displacements as slight as a few nanometers can cause loss of resolution at high magnifications.

FIG. 2 generally shows a system that operates in real time to cancel the effect of vibrations on scanning electron microscope 7 of FIG. 1. Typically, the cancelled vibrations are ones exceeding about twenty to thirty hertz and below about several hundred hertz. It should be noted that the system of FIG. 2 only cancels vibrations in one direction, say the x-direction. In typical practice, a second system is provided for cancelling vibrations in another direction (i.e., the y-direction) which is not aligned with the x-direction. Also, a third system can be provided for cancelling vibrations in the vertical or z-direction. Because the systems for cancelling y and z-direction vibrations are essentially identical to the system for cancelling x-direction vibrations, only the x-direction system is shown in FIG. 2.

In the vibration cancellation system of FIG. 2, sawtooth generator 19 is connected to a summing amplifier 21 which, in turn, is connected to provide voltage to deflection coils $D_1$ and $D_2$. In practice, summing amplifier 21 is normally embodied as a conventional differential operational amplifier. Further, the system of FIG. 2 includes a relative displacement sensor 35 which is usually connected to stage 18 as shown in FIG. 1 but, alternatively, could be connected directly to the body of microscope 7. It should be understood that displacement sensor 35 is connected to provide voltage signals to summing amplifier 21 via variable gain amplifier 39.

Operation of the system of FIG. 2 will now be described. Initially, it should be assumed that sawtooth generator 19 is operating to provide time-varying voltage signals that deflect the electron beam from electron source 13 of SEM 7 of FIG. 1 to scan across stage 18 in the x-direction at a predetermined rate of travel. In the absence of vibrations that cause displacement of stage 18 in the x-direction, there is no voltage output from displacement sensor 35 that affects the scanning voltage applied to deflection coils $D_1$ and $D_2$. However, when vibrations cause stage 18 to move in the x-direction within the sensitivity range of displacement sensor 35, the displacement sensor provides voltage output signals that modify the normal voltage on deflection coils $D_1$ and $D_2$. More particularly, when vibrations occur, voltage signals from displacement sensor 35 are amplified by amplifier 39 of FIG. 2 and then, depending upon their polarity, the amplified signals are added to or subtracted from the scanning signals from saw-tooth voltage generator 19 at summing amplifier 21. The output of summing amplifier 21 (i.e., the modified scanning signals) is then applied to deflection coils $D_1$ and $D_2$. Alternately, independent deflection coils could be provided to receive the correction signals. In practice, the result of operation of the system of FIG. 2 is that the normal scanning pattern of the electron beam is altered in a way which tends to cancel the effects of the vibrations; more particularly, the voltage signals from displacement sensor 35 adjust the scanning pattern of the electron beam of the microscope such that, at any instant, the beam is displaced proportional to the vibration-caused displacement of specimen stage 18. Stated somewhat differently, system of FIG. 2 operates such that the amplified voltage signals from displacement sensor 35 adjust the scanning voltage ramp provided by sawtooth voltage generator 19 to cancel the effects of vibrations on stage 18.

Vibrations in the z-direction of the microscope 7 of FIG. 1 normally do not affect the scanning pattern but can cause images to defocus if changes in the working distance are substantial. To compensate for such problems, output signals from a z-directional sensor can be used to apply correction signals to the current at the final lens $L_3$. The purpose of the correction signals is to change the focal length of the instrument, thus maintaining focus. While this technique is not required with typical scanning electron microscopes because of their substantial depths of field of focus, the technique does have application to some microscopes and instruments which employ scanning electron beams.

In the preferred embodiment of the system of FIG. 2, variable gain amplifier 39 is adjustable manually. This permits convenient initial adjustment of tuning of the vibration cancellation system and allows an operator to improve image resolution by viewing an image provided by the scanning electron microscope of FIG. 1 and then adjusting the amplifier gain so that output signals from displacement sensor 35 do not overcorrect, or under-correct, the electron beam scanning pattern. In practice, initial tuning of the system is accomplished by connecting a vibrating device to shake the body of the microscope at a predetermined frequency, say about seventy to about eighty hertz, and then adjusting the gain of amplifier 39 to reduce the observed effects of the induced vibrations. Normally, the effects of the induced vibrations can be nearly completely cancelled at typical magnifications. Then, when placed in service, the system detects and cancels the effects of vibrations causing displacements as minute as a few nanometers.

FIG. 3 shows one embodiment of components that provide the functions ascribed to the system of FIG. 2. Generally speaking, the arrangement of components in FIG. 3 is particularly adapted for use with displacement sensors which are insensitive to relatively low frequency vibrations. In the illustrated embodiment, the relative displacement sensor comprises a velocity sensor 51 such as a seismometer or geophone which is connected to stage 18 to sense vibratory movement in the x-direction relative to an inertial reference. In practice, a suitable velocity sensor device comprises a movable coil within a magnet. Further in the system of FIG. 3, output signals from velocity sensor 51 are provided to an integrator 59 whose output is connected to variable gain amplifier 39. The output of variable gain amplifier 39, as previously mentioned, is provided to summing amplifier 21 which also receives signals from sawtooth voltage generator 19.

Operation of the system of FIG. 3 will now be described for the case where vibrations cause stage 18 and velocity sensor 51 to move in the x-direction. Under such circumstances, output signals from velocity sensor 51 are integrated by integrator 59 to produce signals whose magnitudes are linearly proportional to the change in position of sensor 51. In other words, the instantaneous magnitude of the output of integrator 59 indicates the distance which sensor 51 has moved relative to the inertial reference. Following integration, the signals are amplified by variable gain amplifier 39 and are provided to summing amplifier 21. Summing amplifier 21 then provides modified scanning signals to deflection coils $D_1$ and $D_2$.

It should be understood that mere adjustment of the gain of amplifier 39 is not necessarily sufficient to completely cancel the effects of all vibrations on velocity sensor 51 of FIG. 3. Situations can arise, for example, where output signals from sensor 51 vary at the same amplitude as the vibrations which cause movement of stage 18, but the phase of the sensor output signals leads or lags the vibrations. Often, the phase difference, can be related to the resonant frequency of velocity sensor 51. For instance, when velocity sensor 51 is embodied as a seismometer, its output signals are normally in phase with vibrations whose frequencies are above the sensor's resonant frequency but are normally out of phase with vibrations whose frequencies are substantially below the sensor's resonant frequency. Such low-frequency behavior of a seismometer often can be ignored, however, if the resonant frequency is sufficiently low, normally below about twenty to thirty hertz, that the vibrations in the range of the damped frequencies affect both chamber 17 and stage 18 equally and, therefore, do not require cancellation.

FIG. 4 shows an alternative arrangement of components to provide the functions ascribed to the system of FIG. 2. Generally speaking, the arrangement of components in FIG. 4 is adapted for use with displacement sensors which are sensitive to both relatively low and high frequency vibrations. In this embodiment, seismometer-type velocity sensor 51 should be understood to be connected to stage 18 and a second seismometer-type velocity sensor 63 should be understood to be connected to the body of microscope 7 of FIG. 1. Output signals from velocity sensors 51 and 63 are provided, respectively, to the non-inverting and inverting inputs of a operational amplifier 65. The output of amplifier 65 is provided to integrator 59 whose output, in turn, is connected to variable gain amplifier 39.

Operation of the system of FIG. 4 will now be described. In situations where vibrations cause both stage 18 and the body of the microscope to move at the same velocity (i.e., in the same direction and at the same speed), velocity sensors 51 and 63 provide equal output signals and those signals cancel one another at differential amplifier 55. Moreover, under such circumstances, correction to the scanning voltage applied to deflection coils $D_1$ and $D_2$ is not required because such vibrations do not normally affect the beam scanning pattern.

In situations where vibrations cause velocity sensor 51 to move at a different velocity than sensor 63 in the sensed direction, amplifier 55 in FIG. 4 produces output signals whose magnitude equals the difference in velocities. Thus, when the output of differential amplifier 45 is integrated at integrator 59, signals are produced whose magnitudes are generally linearly proportional to any changes in position of sensor 51 relative to sensor 63. In other words, the output of integrator 59 indicates the distance which sensor 51 moves relative to sensor 63 (or vice versa). Then, when output signals from integrator 59 are amplified by variable gain amplifier 39 and provided to summing amplifier 21 together with the signals from sawtooth generator 19, scanning signals are produced that operate deflection coils $D_1$ and $D_2$ such that the electron beam scanning pattern in the x-direction is adjusted in a manner which substantially cancels the effects of the sensed vibrations. In the system of FIG. 4, as in the system of FIG. 3, the effects of relatively high-frequency vibrations are usually effectively cancelled when the velocity sensors are chosen to have resonant frequencies less than about twenty to thirty hertz.

Although the systems of FIGS. 3 and 4 only cancel vibrations in one direction, substantially identical systems can be, and normally are, provided to cancel vibrations in a second, or second and third, non-aligned direction. In practice it is usually most convenient to chose the non-aligned directions to be mutually perpendicular and aligned with the respective x, y and z cartesian coordinates. In the case of a two-coordinate system, for example, the first vibration cancellation system would operate upon x-direction vibrations affecting the deflection coils $D_1$ and $D_2$ of FIG. 1 and the second vibration cancellation system would operate upon y-direction vibrations affecting the deflection coils $D_3$ and $D_4$. In cases where the sensors are not exactly aligned with the scanning directions, the sensor outputs can be decoupled for mapping in the scanning directions.

Although the present invention has been described in its preferred embodiment, those skilled in the art will appreciate that alternative not specifically described in the preferred embodiment may be selected without departing from the spirit and scope of the invention as defined in the appended claims. For example, workers skilled in the art will appreciate that the vibration cancellation system can be applied to instruments other than scanning electron microscopes with only slight modifications in the methodology. Specifically, the vibration cancellation system has potential application to scanning laser microscopes, scanning transmission electron microscopes, and scanning tunneling microscopes.

As another example of an alternative within the scope of the appended claims, it should be appreciated that the velocity sensors of FIGS. 3 and 4 can be used to provide correction values to stored digital images. More particularly, in the case of stored digital images, pixel information can be moved a distance proportional to the relative motion of the sensors and, where the scan rate is greater than the bandwidth of the velocity sensor, whole scan lines can be displaced in accordance with sensed relative motion. Also, where digital image storage techniques are employed, effects due to the output signals from velocity detectors leading or lagging vibrations are overcome by shifting stored information.

Finally, although the preceding discussion has emphasized seismometer-type velocity sensors for detecting relative motion, other types of relative motion detectors could be employed. For example, the above-described preceding systems could operate with capacitance proximity probes, eddy current proximity probes, and linear voltage differential transformer (LVDT) displacement sensors.

In the claims:

1. A system for adjusting the scanning pattern of an electron beam in a scanning electron microscope to decrease image sensitivity to vibrations, comprising:
   at least one velocity sensor means comprising a seismometer means having a resonant frequency less than about thirty hertz connected to the scanning electron microscope to sense vibrations in at least one direction;
   integrator means for integrating output signals from the velocity sensor means;
   beam steering means connected to receive the integrated signals from the velocity sensor means and operative, in response to the received signals, to adjust the normal scanning pattern of the electron beam of the microscope in a way that reduces the effects of the sensed vibrations on images provided by the scanning electron microscope.

2. A system according to claim 1 wherein the velocity sensor means includes at least two seismometers.

3. A system according to claim 2 wherein each of the at least two seismometers is of the type having a moving coil within a magnet.

4. A system according to claim 1 further including a variable gain amplifier to adjustably increase the amplitude of output signals from the integrator means.

5. A system according to claim 1 wherein at least one of the velocity sensor means is arranged to detect vibrations in a first direction and one other of the velocity sensor means is arranged to detect vibrations in a second direction which is not parallel to the first direction.

6. A system to adjust the scanning pattern of an electron beam in scanning electron microscopes to decrease image sensitivity to vibrations, comprising:
   velocity sensor means connected to the scanning electron microscope to sense vibrations in at least one direction, the velocity sensor means comprising seismometer means having a resonant frequency less than about thirty hertz;
   integrator means to integrate output signals from the velocity sensor means, thereby to indicate displacement of the specimen stage;
   beam steering means connected to receive displacement signals from the integrator means and operative to adjust the normal scanning pattern of the electron beam of the microscope in a way that reduces the effects of the sensed vibrations on images provided by the microscope.

7. A system according to claim 6 further including a variable gain amplifier to adjustably increase the amplitude of the output of the integrator means.

8. A system according to claim 6 wherein at least two of the velocity sensor means are provided, and one of the velocity sensor means is arranged to detect vibrations in a first direction and another of the velocity sensor means is arranged to detect vibrations in a second direction which is not parallel to the first direction.

9. A system to adjust the scanning pattern of an electron beam in scanning electron microscopes to decrease image sensitivity to vibrations, comprising:
   a first velocity sensor connected to the specimen stage of the scanning electron microscope to sense vibrations of the stage in a first direction, the first velocity sensor means comprising seismometer means having a resonant frequency less than about thirty hertz;
   a second velocity sensor connected to the specimen stage of the scanning electron microscope to sense vibrations in a second direction which is not parallel to the first direction, the second velocity sensor means also comprising seismometer means having a resonant frequency less than about thirty hertz;
   first integrator means to integrate output signals from the first velocity sensor to indicate displacement of the first sensor in the first direction;
   second integrator means to integrate output signals from the second velocity sensor to indicate displacement of the second sensor in the second direction;
   first beam steering means connected to receive output signals from the first integrator means and operative to adjust the scanning pattern of the electron beam of the microscope in a way which reduces the effects of vibrations on the electron beam scanning pattern in the first direction;
   second beam steering means connected to receive output signals from the second integrator means and operative to adjust the scanning pattern of the electron beam in a way which reduces the effects of vibrations on the electron beam scanning pattern in the second direction.

10. A system according to claim 9 further including first and second variable gain amplifiers that are connected to adjustably increase the amplitude of the outputs of the first and second velocity sensors, respectively.

11. A system according to claim 9 wherein the first direction is generally perpendicular to the second direction.

12. A system to adjust the scanning pattern of an electron beam in scanning electron microscopes to decrease image sensitivity to vibrations, comprising:
   first and second velocity sensors connected, respectively, to the specimen stage and body of a scanning electron microscope to sense vibrations of the stage relative to the body in a first direction, the first and second velocity sensors each comprising a seismometer means having a resonant frequency less than about thirty hertz;

third and fourth velocity sensors connected, respectively, to the specimen stage and body of the scanning electron microscope to sense vibrations of the stage relative to the microscope body in a second direction not aligned with the first direction, the third and fourth velocity sensors having a resonant frequency less than about thirty hertz;

first amplifier means to provide outputs proportional to differences in magnitude of the outputs of the first and second velocity sensors;

second amplifier means to provide outputs proportional to differences in magnitude of the outputs of the third and fourth velocity sensors;

first integrator means to integrate output signals from the first amplifier means to indicate relative displacement in the first direction between the first and second velocity sensors;

second integrator means to integrate output signals for the second amplifier means to indicate relative displacement in the second direction between the third and fourth velocity sensors;

first steering adjustment means connected to receive amplified output signals from the first integrator means and operative to adjust the scanning pattern of the electron beam of the microscope to reduce the effects of vibrations on images in the first direction; and second steering means connected to receive output signals from the second integrator means and operative to adjust the scanning pattern of the electron beam of the microscope to reduce the effects of vibrations on images in the second direction.

13. A system according to claim 12 further including first and second variable gain amplifiers which are connected to adjustably increase the amplitude of the output of the respective first and second integrator means.

14. A system according to claim 12 wherein the first direction is generally perpendicular to the second direction.

15. A system to decrease the image sensitivity of scanning electron microscopes to vibrations, comprising:

velocity sensor means connected to the scanning electron microscope to sense vibrations in at least one direction, the velocity sensor means comprising a seismometer means having a resonant frequency less than about thirty hertz;

integrator means to integrate output signals from the velocity sensor means, thereby to indicate displacement of the specimen stage; and adjustment means connected to receive displacement signals from the integrator means and operative to store and adjust image information provided by the microscope in a way which reduces the effects of sensed vibrations.

16. A system according to claim 15 wherein the adjustment means operates to adjust the position at which image information is stored.

17. A system according to claim 15 wherein the adjustment means operates in real time to adjust the scanning pattern of the electron beam in the microscope.

* * * * *